US010476657B2

(12) United States Patent
Wang

(10) Patent No.: US 10,476,657 B2
(45) Date of Patent: Nov. 12, 2019

(54) DEVICE AND METHOD FOR SUPPORTING CLOCK TRANSFER OF MULTIPLE CLOCK DOMAINS

(71) Applicant: Huawei Technologies Co., Ltd., Shenzhen (CN)

(72) Inventor: Jinhui Wang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/265,617

(22) Filed: Feb. 1, 2019

(65) Prior Publication Data
US 2019/0165927 A1    May 30, 2019

Related U.S. Application Data

(63) Continuation of application No. 16/107,300, filed on Aug. 21, 2018, which is a continuation of application No. PCT/CN2016/076106, filed on Mar. 11, 2016.

(51) Int. Cl.
*H04L 7/00* (2006.01)
*H04J 3/06* (2006.01)
(Continued)

(52) U.S. Cl.
CPC .............. *H04L 7/0087* (2013.01); *H03L 7/00* (2013.01); *H03L 7/22* (2013.01); *H04J 3/0685* (2013.01);
(Continued)

(58) Field of Classification Search
CPC ... H04L 7/0031; H04L 7/0087; H04L 7/0025; H04L 7/02; H04L 7/0331; H04L 7/0337; H04L 7/06; H04L 7/04
See application file for complete search history.

(56) References Cited

U.S. PATENT DOCUMENTS 5,754,437 A    5/1998 Blazo
6,047,383 A    4/2000 Self et al.
(Continued)

FOREIGN PATENT DOCUMENTS

CN    1770633 A    5/2006
CN    1770634 A    5/2006
(Continued)

OTHER PUBLICATIONS

Machine Translation and Abstract of Chinese Publication No. CN1770633, May 10, 2006, 13 pages.
(Continued)

*Primary Examiner* — Khanh C Tran
(74) *Attorney, Agent, or Firm* — Conley Rose, P.C.

(57) ABSTRACT

A device and a method for supporting clock transfer of multiple clock domains, where the device includes N phase frequency detectors, N filters, N clock reconstructors, and N clock domain interfaces, where N is an integer greater than or equal to two, the N clock domain interfaces are in a one-to-one correspondence with the N phase frequency detectors, the N filters, and the N clock reconstructors, the N phase frequency detectors are respectively connected to N clock sources, and at least two clock sources of the N clock sources are different. The foregoing device flexibly adapt to multiple different clock domains, implement that a single device simultaneously supports clock transfer of multiple clock domains, and flexibly satisfy user demands without adding or replacing devices.

20 Claims, 3 Drawing Sheets

(51) Int. Cl.
*H04L 7/06* (2006.01)
*H03L 7/22* (2006.01)
*H03L 7/00* (2006.01)

(52) U.S. Cl.
CPC .............. *H04L 7/06* (2013.01); *H04J 3/0688* (2013.01); *H04J 3/0691* (2013.01); *H04J 3/0697* (2013.01)

(56) References Cited

U.S. PATENT DOCUMENTS

| | | | |
|---|---|---|---|
| 6,516,362 | B1 | 2/2003 | Magro et al. |
| 6,928,528 | B1 | 8/2005 | Hewitt |
| 7,405,628 | B2 * | 7/2008 | Hulfachor ............... H03L 7/087 327/147 |
| 7,443,250 | B2 * | 10/2008 | Seethamraju ........... H03L 7/087 331/11 |
| 7,451,337 | B1 | 11/2008 | Hewitt |
| 8,892,934 | B2 * | 11/2014 | Gotz ........................ G04G 7/00 375/356 |
| 9,479,181 | B1 * | 10/2016 | Ding ....................... H03L 7/087 |
| 9,742,549 | B1 * | 8/2017 | Wang .................... H04J 3/0647 |
| 2003/0197537 | A1 * | 10/2003 | Saint-Laurent ........... G06F 1/10 327/165 |
| 2009/0115534 | A1 | 5/2009 | Imenes et al. |
| 2011/0022934 | A1 | 1/2011 | Oh et al. |
| 2012/0106687 | A1 | 5/2012 | Bulzacchelli et al. |
| 2013/0089170 | A1 | 4/2013 | Chiesa et al. |
| 2014/0286357 | A1 | 9/2014 | Shenoi et al. |
| 2016/0308633 | A1 | 10/2016 | Liu et al. |
| 2018/0159541 | A1 * | 6/2018 | Spijker ................. H04J 3/0697 |
| 2018/0159542 | A1 * | 6/2018 | Spijker ..................... H03L 7/07 |

FOREIGN PATENT DOCUMENTS

| | | |
|---|---|---|
| CN | 102315927 A | 1/2012 |
| CN | 103959688 A | 7/2014 |
| CN | 105281752 A | 1/2016 |
| WO | 2015096041 A1 | 7/2015 |

OTHER PUBLICATIONS

Machine Translation and Abstract of Chinese Publication No. CN1770634, May 10, 2006, 14 pages.
Machine Translation and Abstract of Chinese Publication No. CN102315927, Jan. 11, 2012, 14 pages.
Machine Translation and Abstract of Chinese Publication No. CN105281752, Jan. 27, 2016, 8 pages.
"IEEE Standard for a Precision Clock Synchronization Protocol for Networked Measurement and Control Systems, IEEE Instrumentation and Measurement Society," IEEE Std 1588™, Jul. 24, 2008, 289 pages.
"Series G: Transmission Systems and Media, Digital Systems and Networks, Digital networks—Design objectives for digital networks, Timing characteristics of SDH equipment slave clocks (SEC)," ITU-T G.813, Mar. 2003, 36 pages.
"Series G: Transmission Systems and Media, Digital Systems and Networks, Digital networks—Design objectives for digital networks, Timing characteristics of SDH equipment slave clocks (SEC), Corrigendum 1," ITU-T G.813 Corrigendum 1, Jun. 2005, 10 pages.
"Series G: Transmission Systems and Media, Digital Systems and Networks, Packet over Transport aspects—Quality and availability targets, Series Y: Global Information Infrastructure, Internet Protocol Aspects and Next-Generation Networks, Internet protocol aspects—Transport, Timing and synchronization aspects in packet networks," ITU-T G.8261/Y.1361, Aug. 2013, 116 pages.
"Series G: Transmission Systems and Media, Digital Systems and Networks, Packet over Transport aspects—Synchronization, quality and availability targets, Series Y: Global Information Infrastructure, Internet Protocol Aspects and Next-Generation Networks, Internet protocol aspects—Transport, Distribution of timing information through packet networks, Amendment 1," ITU-T G.8264/Y.1364, Amendment 1, Jan. 2015, 8 pages.
"Series G: Transmission Systems and Media, Digital Systems and Networks, Packet over Transport aspects—Synchronization, quality and availability targets, Series Y: Global Information Infrastructure, Internet Protocol Aspects and Next-Generation Networks, Internet protocol aspects—Transport, Timing characteristics of synchronous Ethernet equipment slave clock," ITU-T G.8262/Y.1362, Jan. 2015, 38 pages.
"Series G: Transmission Systems and Media, Digital Systems and Networks, Packet over Transport aspects—Synchronization, quality and availability targets, Series Y: Global Information Infrastructure, Internet Protocol Aspects and Next-Generation Networks, Internet protocol aspects—Transport, Distribution of timing information through packet networks," ITU-T G.8264/Y.1364, May 2014, 40 pages.
"Series G: Transmission Systems and Media, Digital Systems and Networks, Packet over Transport aspects—Synchronization, quality and availability targets, Series Y: Global Information Infrastructure, Internet Protocol Aspects and Next-Generation Networks, Internet protocol aspects—Transport, Timing and synchronization aspects in packet networks, Amendment 1," ITU-T G.8261/Y.1361, Amendment 1, Jan. 2015, 8 pages.
Foreign Communication From a Counterpart Application, European Application No. 16893063.4, Extended European Search Report dated Jan. 21, 2019, 8 pages.
Foreign Communication From a Counterpart Application, PCT Application No. PCT/CN2016/076106, English Translation of International Search Report dated Dec. 12, 2016, 2 pages.
Foreign Communication From a Counterpart Application, Chinese Application No. 201680001517.X, Chinese Office Action dated Sep. 5, 2019, 7 pages.

\* cited by examiner

300

An $i^{th}$ phase frequency detector in N phase frequency detectors receives a clock signal generated by a clock source connected to the $i^{th}$ phase frequency detector, determines $i^{th}$ phase difference information between a common reference clock signal and the clock signal, and sends the $i^{th}$ phase difference information to an $i^{th}$ filter in N filters that corresponds to the $i^{th}$ phase frequency detector ~S310

The $i^{th}$ filter receives the $i^{th}$ phase difference information sent by the $i^{th}$ phase frequency detector, converts the $i^{th}$ phase difference information into $i^{th}$ frequency difference information, and sends the $i^{th}$ frequency difference information to an $i^{th}$ clock reconstructor in N clock reconstructors that corresponds to the $i^{th}$ filter ~S320

The $i^{th}$ clock reconstructor receives the $i^{th}$ frequency difference information sent by the $i^{th}$ filter, reconstructs an $i^{th}$ network timing clock in the device according to the common reference clock signal and the $i^{th}$ frequency difference information, and sends the $i^{th}$ network timing clock to an $i^{th}$ clock domain interface in N clock domain interfaces ~S330

FIG. 5

DEVICE AND METHOD FOR SUPPORTING CLOCK TRANSFER OF MULTIPLE CLOCK DOMAINS

CROSS-REFERENCE TO RELATED APPLICATIONS

This application is a continuation of U.S. patent application Ser. No. 16/107,300 filed on Aug. 21, 2018, which is a continuation of International Patent Application No. PCT/CN2016/076106 filed on Mar. 11, 2016. Both of the aforementioned applications are hereby incorporated by reference in their entireties.

TECHNICAL FIELD

This application relates to the field of communications technologies, and in particular, to a device and method for supporting clock transfer of multiple clock domains.

BACKGROUND

In a network evolution process, for example, in a network reconstruction evolution process of a metropolitan area network, an original fixed network service is borne by a Synchronous Digital Hierarchy (SDH) device. A newly established mobile service is borne by an Internet Protocol (IP) device. The two types of services may coexist in a quite long time. Therefore, a hybrid service bearing device needs to bear multiple types of services at the same time.

An SDH service requires the hybrid service bearing device to establish a top-down frequency synchronization network. The mobile service requires, in a Long Term Evolution-Advanced (LTE-A) age, the hybrid service bearing device to have a capability of bearing a synchronous Ethernet and 1588v2 clock, and be capable of obtaining frequency synchronization and time synchronization from a Global Navigation Satellite System (GNSS). In addition, the hybrid service bearing device may further need to support a synchronization network evolved to higher precision in the future. Different synchronization networks may have different precision and different clock sources. Currently, the hybrid service bearing device can only separately transfer data of multiple different types of services to corresponding devices and cannot simultaneously transfer clock signals generated by clock sources of multiple different types of services. With evolution of wireless technologies and fixed network technologies, a demand for supporting, by a network device, multiple different clock domains becomes increasingly popular.

The International Telecommunication Union Telecommunication Standardization Sector (ITU-T) defines reference models of various synchronization network devices but does not define how to bear clock signals of multiple different clock domains using a same device simultaneously.

SUMMARY

In view of the above, embodiments of this application provide a device and a method for supporting clock transfer of multiple clock domains in order to support clock transfer of multiple different clock domains using a same device.

According to a first aspect, a device for supporting clock transfer of multiple clock domains is provided. The device includes N phase frequency detectors, N filters, N clock reconstructors, and N clock domain interfaces. N is an integer greater than or equal to 2. The N clock domain interfaces are in a one-to-one correspondence with the N phase frequency detectors, the N filters, and the N clock reconstructors. The N phase frequency detectors are respectively connected to N clock sources, and at least two clock sources of the N clock sources are different.

An $i^{th}$ phase frequency detector in the N phase frequency detectors is configured to receive a clock signal generated by a clock source connected to the $i^{th}$ phase frequency detector, determine $i^{th}$ phase difference information between a common reference clock signal and the clock signal, and send the $i^{th}$ phase difference information to an $i^{th}$ filter in the N filters that corresponds to the $i^{th}$ phase frequency detector.

The $i^{th}$ is filter configured to receive the $i^{th}$ phase difference information sent by the $i^{th}$ phase frequency detector, convert the $i^{th}$ phase difference information into $i^{th}$ frequency difference information, and send the $i^{th}$ frequency difference information to an $i^{th}$ clock reconstructor in the N clock reconstructors that corresponds to the $i^{th}$ filter.

The $i^{th}$ clock reconstructor is configured to receive the $i^{th}$ frequency difference information sent by the $i^{th}$ filter, reconstruct an $i^{th}$ network timing clock in the device according to the common reference clock signal and the $i^{th}$ frequency difference information, and send the $i^{th}$ network timing clock to an $i^{th}$ clock domain interface in the N clock domain interfaces.

Furthermore, i is an integer and satisfies $1 \leq i \leq N$.

In this way, because inside one device, internal transfer of only one type of clock signal is supported, after clock signals of multiple different clock sources are received, a common reference clock signal is still transferred in the device, and clock reconstructors reconstruct clock signals of different clock domains at clock source interfaces and separately send the clock signals to other clock domain interfaces of this clock domain, to further implement network-level clock synchronization. The foregoing device implements clock transfer of multiple clock domains by extracting differences between clock signals of different clock sources and the common reference clock.

In the device for supporting clock transfer of multiple clock domains in this embodiment of this application, a phase frequency detector obtains phase difference information between a clock signal generated by a clock source of each clock domain and a common reference clock signal, then a filter converts the phase difference information into frequency difference information, and finally, a clock reconstructor synthesizes a clock signal of a needed clock domain and applies the clock signal to a clock domain interface of each clock domain in order to flexibly adapt to multiple different clock domains and implement that a single device simultaneously supports clock transfer of multiple clock domains, user demands can be flexibly satisfied without adding or replacing devices.

Optionally, the N phase frequency detectors may be double-D digital phase detectors or time-to-digital converters (TDCs).

Optionally, the N filters may each include a digital filter module and a conversion module. The digital filter module may use a universal seven-order finite impulse response (FIR) filter module.

Optionally, the N clock reconstructors may be direct digital frequency synthesizers (DDSs) or number controlled oscillators (NCOs).

Optionally, the phase difference information and the frequency difference information may be encapsulated into a Layer-2 Ethernet packet for transferring.

In a first possible implementation of the first aspect, the device further includes an $(N+1)^{th}$ phase frequency detector and an external synchronization interface, where the $(N+1)^{th}$ phase frequency detector is connected to an external clock source using the external synchronization interface.

The $(N+1)^{th}$ phase frequency detector is configured to receive a clock signal generated by the external clock source, determine $(N+1)^{th}$ phase difference information between the clock signal generated by the external clock source and the common reference clock signal, and send the $(N+1)^{th}$ phase difference information to a $j^{th}$ filter in the N filters.

The $j^{th}$ filter is configured to receive the $(N+1)^{th}$ phase difference information sent by the $(N+1)^{th}$ phase frequency detector, convert the $(N+1)^{th}$ phase difference information into $(N+1)^{th}$ frequency difference information, and send the $(N+1)^{th}$ frequency difference information to a $j^{th}$ clock reconstructor in the N clock reconstructors that corresponds to the $j^{th}$ filter.

The $j^{th}$ clock reconstructor is configured to receive the $(N+1)^{th}$ frequency difference information sent by the $j^{th}$ filter, reconstruct an $(N+1)^{th}$ network timing clock in the device according to the common reference clock signal and the $(N+1)^{th}$ frequency difference information, and send the $(N+1)^{th}$ network timing clock to a $j^{th}$ clock domain interface in the N clock domain interfaces.

The j is an integer and satisfies $1 \leq j \leq N$.

In this way, the device can receive and reconstruct a clock signal from an external synchronization interface while supporting clock signal transfer of multiple different clock domains, and ensures that each clock domain interface of the device can receive the clock signal from the external synchronization interface according to needs. If the clock signal from the external synchronization interface has higher precision compared with a clock signal of each clock domain interface, the clock domain interface may use the clock signal from the external synchronization interface as a network timing clock of the clock domain interface in order to improve precision of clock signals in the device.

With reference to the foregoing possible implementation of the first aspect, in a second possible implementation of the first aspect, the device further includes an $(N+1)^{th}$ clock reconstructor.

A $k^{th}$ filter in the N filters is configured to send $k^{th}$ frequency difference information generated by the $k^{th}$ filter to the $(N+1)^{th}$ clock reconstructor.

The $(N+1)^{th}$ clock reconstructor is configured to receive the $k^{th}$ frequency difference information sent by the $k^{th}$ filter, reconstruct a $k^{th}$ network timing clock in the device according to the $k^{th}$ frequency difference information, and send the $k^{th}$ network timing clock to the external synchronization interface.

The k is an integer and satisfies $1 \leq k \leq N$.

In the device of this embodiment of this application, clock signals from multiple different clock domains not only can be transferred between clock domain interfaces of the device but also can be transferred, using an external synchronization interface, to another device connected to the device in order to implement a performance test for clock signals in the device.

With reference to the foregoing possible implementation of the first aspect, in a third possible implementation of the first aspect, the device further includes an input selector.

The $i^{th}$ phase frequency detector is further configured to send the $i^{th}$ phase difference information to the input selector.

The input selector is configured to receive the $i^{th}$ phase difference information sent by the $i^{th}$ phase frequency detector, and send, based on a correspondence between the $i^{th}$ phase frequency detector and the $i^{th}$ filter, the $i^{th}$ phase difference information to the $i^{th}$ filter.

With reference to the foregoing possible implementation of the first aspect, in a fourth possible implementation of the first aspect, the input selector is further configured to when clock sources of the N clock domain interfaces correspond to M types of services, select M pieces of phase difference information from phase difference information sent by the N phase frequency detectors, where the M pieces of phase difference information are in a one-to-one correspondence with the M types of services, and send, based on a correspondence between the N phase frequency detectors and the N filters, corresponding phase difference information to each filter in the N filters, where M is an integer less than N.

Further, when N services corresponding to the N clock domain interfaces include same services, the same services are classified as one type of service. Therefore, it is set that the N services include M types of services. The input selector may perform a source selection operation on phase difference information from clock sources of the N services and select M pieces of phase difference information corresponding to the M types of services from N pieces of phase difference information corresponding to the N services such that services of a same type in the N services all follow an optimal clock source in this type.

Optionally, the foregoing input selector may be implemented in the device using software of a central processing unit (CPU) or using field-programmable gate array (FPGA) hardware. This is not limited in this embodiment of this application.

With reference to the foregoing possible implementation of the first aspect, in a fifth possible implementation of the first aspect, the device further includes an output selector.

The $i^{th}$ filter is further configured to send the $i^{th}$ frequency difference information to the output selector.

The output selector is configured to receive the $i^{th}$ frequency difference information sent by the $i^{th}$ filter, and send the $i^{th}$ frequency difference information to the $i^{th}$ clock reconstructor based on a correspondence between the $i^{th}$ filter and the $i^{th}$ clock reconstructor.

Optionally, the foregoing output selector may be implemented in the device using software of a CPU or using an FPGA hardware. This is not limited in this embodiment of this application.

With reference to the foregoing possible implementation of the first aspect, in a sixth possible implementation of the first aspect, the device further includes a common reference clock generator configured to generate the common reference clock signal before the $i^{th}$ phase difference information between the common reference clock signal and the clock signal is determined, and send the common reference clock signal to the $i^{th}$ phase frequency detector and the $i^{th}$ clock reconstructor.

According to a second aspect, a method for supporting clock transfer of multiple clock domains is provided. The method includes receiving, by an $i^{th}$ phase frequency detector in N phase frequency detectors, a clock signal generated by a clock source connected to the $i^{th}$ phase frequency detector, determining $i^{th}$ phase difference information between a common reference clock signal and the clock signal, and sending the $i^{th}$ phase difference information to an filter in N filters that corresponds to the $i^{th}$ phase frequency detector, receiving, by the $i^{th}$ filter, the $i^{th}$ phase difference information sent by the $i^{th}$ phase frequency detector, converting the $i^{th}$ phase difference information into $i^{th}$ frequency difference information, and sending the $i^{th}$ frequency difference information to an $i^{th}$ clock reconstructor in N clock reconstructors that corresponds to the $i^{th}$ filter, and receiving, by the $i^{th}$ clock reconstructor, the $i^{th}$ frequency difference information sent by the $i^{th}$ $i^{th}$ filter, reconstructing an network timing clock in the device according to the common reference clock signal and the $i^{th}$ frequency difference information, and sending the $i^{th}$ network timing clock to an $i^{th}$ clock domain interface in N clock domain interfaces, where N is an integer greater than or equal to 2, the N clock domain interfaces are in a one-to-one correspondence with the N phase frequency detectors, the N filters, and the N clock reconstructors, the N phase frequency detectors are respectively connected to N clock sources, at least two clock sources of the N clock sources are different, and i is an integer and satisfies 1≤i≤N.

In a first possible implementation of the second aspect, the method further includes receiving, by an $(N+1)^{th}$ phase frequency detector, a clock signal generated by an external clock source, determining $(N+1)^{th}$ phase difference information between the clock signal generated by the external clock source and the common reference clock signal, and sending the $(N+1)^{th}$ phase difference information to a $j^{th}$ filter in the N filters, receiving, by the $j^{th}$ filter, the $(N+1)^{th}$ phase difference information sent by the $(N+1)^{th}$ phase frequency detector, converting the $(N+1)^{th}$ phase difference information into $(N+1)^{th}$ frequency difference information, and sending the $(N+1)^{th}$ frequency difference information to a $j^{th}$ clock reconstructor in the N clock reconstructors that corresponds to the $j^{th}$ filter, and receiving, by the $j^{th}$ clock reconstructor, the $(N+1)^{th}$ frequency difference information sent by the $j^{th}$ filter, reconstructing an $(N+1)^{th}$ network timing clock in the device according to the common reference clock signal and the $(N+1)^{th}$ frequency difference information, and sending the $(N+1)^{th}$ network timing clock to a $j^{th}$ clock domain interface in the N clock domain interfaces, where the $(N+1)^{th}$ phase frequency detector is connected to an external clock source using an external synchronization interface, and j is an integer and satisfies 1≤j≤N.

With reference to the foregoing possible implementation of the second aspect, in a second possible implementation of the second aspect, the method further includes sending, by a $k^{th}$ filter in the N filters, $k^{th}$ frequency difference information generated by the $k^{th}$ filter to an $(N+1)^{th}$ clock reconstructor, and receiving, by the $(N+1)^{th}$ clock reconstructor, the $k^{th}$ frequency difference information sent by the $k^{th}$ filter, reconstructing a $k^{th}$ network timing clock in the device according to the $k^{th}$ frequency difference information, and sending the $k^{th}$ network timing clock to the external synchronization interface, where k is an integer and satisfies 1≤k≤N.

With reference to the foregoing possible implementation of the second aspect, in a third possible implementation of the second aspect, sending the $i^{th}$ phase difference information to an $i^{th}$ filter in N filters that corresponds to the $i^{th}$ phase frequency detector includes sending, by the $i^{th}$ phase frequency detector, the $i^{th}$ phase difference information to an input selector, and receiving, by the input selector, the $i^{th}$ phase difference information sent by the phase $i^{th}$ frequency detector, and sending, based on a correspondence between the $i^{th}$ phase frequency detector and the $i^{th}$ filter, the $i^{th}$ phase difference information to the $i^{th}$ filter.

With reference to the foregoing possible implementation of the second aspect, in a fourth possible implementation of the second aspect, after receiving, by the input selector, the $i^{th}$ phase difference information sent by the $i^{th}$ phase frequency detector, the method further includes, when clock sources of the N clock domain interfaces correspond to M types of services, selecting, by the input selector, M pieces of phase difference information from phase difference information sent by the N phase frequency detectors, where the M pieces of phase difference information are in a one-to-one correspondence with the M types of services, and sending the $i^{th}$ phase difference information to the $i^{th}$ filter includes sending, based on a correspondence between the N phase frequency detectors and the N filters, corresponding phase difference information to each filter in the N filters, where M is an integer less than N.

With reference to the foregoing possible implementation of the second aspect, in a fifth possible implementation of the second aspect, sending the $i^{th}$ frequency difference information to an $i^{th}$ clock reconstructor in N clock reconstructors that corresponds to the $i^{th}$ filter includes sending, by the $i^{th}$ filter, the $i^{th}$ frequency difference information to an output selector, and receiving, by the output selector, the $i^{th}$ frequency difference information sent by the $i^{th}$ filter, and sending the $i^{th}$ frequency difference information to the $i^{th}$ clock reconstructor based on a correspondence between the $i^{th}$ filter and the $i^{th}$ clock reconstructor.

With reference to the foregoing possible implementation of the second aspect, in a sixth possible implementation of the second aspect, before the determining $i^{th}$ phase difference information between a common reference clock signal and the clock signal, the method further includes generating, by a common reference clock generator, the common reference clock signal and sending the common reference clock signal to the $i^{th}$ phase frequency detector and the $i^{th}$ clock reconstructor.

The method in the second aspect may be executed by the device in the foregoing first aspect or any possible implementation of the first aspect.

According to a third aspect, a computer readable medium is provided, to store a computer program, where the computer program includes instructions for executing the method in the second aspect or any possible implementation of the second aspect.

BRIEF DESCRIPTION OF DRAWINGS

To describe the technical solutions in the embodiments of this application more clearly, the following briefly describes the accompanying drawings required for describing the embodiments of this application. The accompanying drawings in the following description show merely some embodiments of this application, and a person of ordinary skill in the art may still derive other drawings from these accompanying drawings without creative efforts.

FIG. 5 is a flowchart of a method for supporting clock transfer of multiple clock domains according to an embodiment of this application.

DESCRIPTION OF EMBODIMENTS

The following clearly describes the technical solutions in the embodiments of this application with reference to the accompanying drawings in the embodiments of this application. The described embodiments are a part rather than all of the embodiments of this application. All other embodiments can be obtained by persons of ordinary skill in the art based on the embodiments of this application without creative efforts.

The embodiments of this application can be applied to various communications systems. Therefore, application scenarios of the technical solutions provided by the embodiments of this application are not limited to a particular communications system. A communications system used in an application scenario of the technical solutions may be a Global System for Mobile Communications (GSM) system, a Code Division Multiple Access (CDMA) system, a Wideband CDMA (WCDMA) system, a general packet radio service (GPRS), a Long Term Evolution (LTE) system, an LTE frequency division duplex (FDD) system, an LTE time division duplex (TDD) system, or a Universal Mobile Telecommunications System (UMTS).

A device in the embodiments of this application may be a network device, may be a terminal device, or may be another transmission node. This is not limited in the embodiments of this application. The network device may include a base station and a base station controller. The base station may be a device configured to communicate with a terminal device. For example, a base station may be a base station (BTS) in the GSM system or CDMA, or may be a base station (NodeB (NB)) in WCDMA, or may be an evolved NodeB (eNB or eNodeB) in LTE. Alternatively, the base station may be a relay station, an access point, a vehicle-mounted device, or a network side device in a future fifth generation (5G) network. The base station controller may schedule a service between base stations using a transmission node. The transmission node may be an Ethernet switch, an IP router, a packet transport network (PTN), a microwave device, or an optical transport network (OTN). The terminal device may refer to an access terminal, user equipment (UE), a user unit, a user station, a mobile site, a mobile station, a remote station, a remote terminal, a mobile device, a user terminal, a terminal, a wireless communications device, a user agent, or a user apparatus. The access terminal may be a cellular telephone, a cordless telephone, a Session Initiation Protocol (SIP) telephone, a Wireless Local Loop (WLL) station, a personal digital assistant (PDA), a handheld device having a wireless communications function, a computing device or another processing device connected to a wireless modem, a vehicle-mounted device, a wearable device, a terminal device in a future 5G network, or a terminal device in a future evolved Public Land Mobile Network (PLMN).

Figure 1:
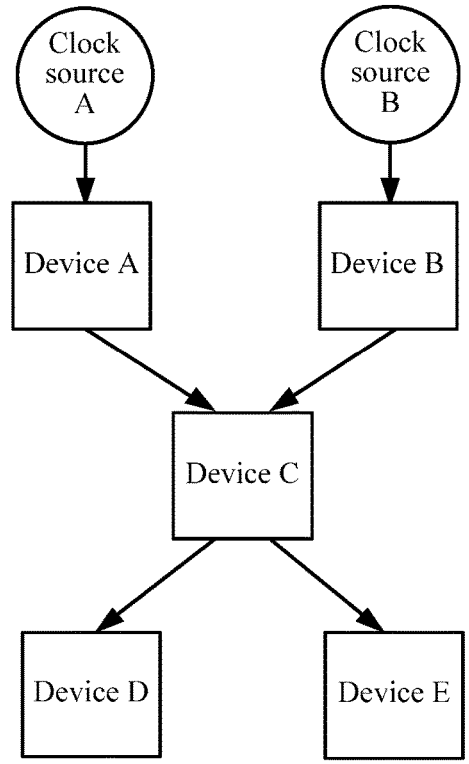
FIG. 1 is a schematic diagram of an application scenario according to an embodiment of this application.

FIG. 1 is a schematic diagram of an application scenario according to an embodiment of this application. The application scenario shown in FIG. 1 includes a clock source A, a clock source B, a device A, a device B, a device C, a device D, and a device E. The clock source A and the clock source B are respectively clock sources of two different types of services. A clock source of the device A is the clock source A. A clock source of the device B is the clock source B. Service data packets respectively borne by the device A and the device B are simultaneously transferred to the device C, and the device C then transfers a service data packet of the device A to the device D and transfers a service data packet of the device B to the device E. The architecture bears two different types of services, that is, two types of synchronization networks. Therefore, the device C may be referred to as a hybrid service bearing device.

It should be understood that FIG. 1 only shows an example of the application scenario including two clock sources. Optionally, the system may further include more clock sources and more devices. This is not limited in this embodiment of this application.

Figure 2:
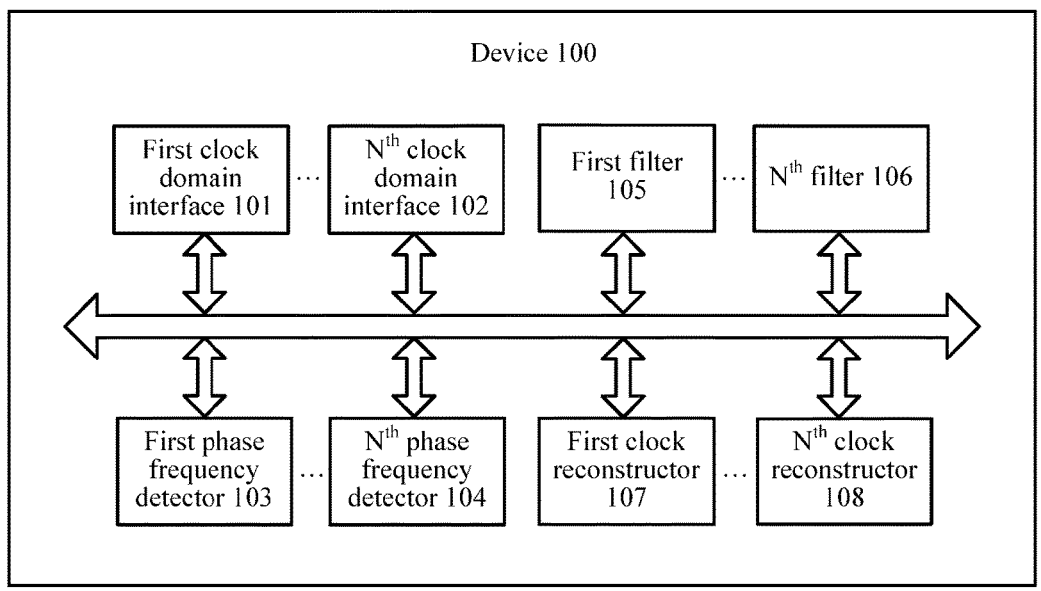
FIG. 2 is a schematic block diagram of a device for supporting clock transfer of multiple clock domains according to an embodiment of this application.

FIG. 2 is a schematic block diagram of a device 100 for supporting clock transfer of multiple clock domains according to an embodiment of this application. The device 100 may correspond to a hybrid service bearing device C in FIG. 1. The device 100 includes N clock domain interfaces (including a first clock domain interface 101 to an $N^{th}$ clock domain interface 102), N phase frequency detectors (including a first phase frequency detector 103 to an $N^{th}$ phase frequency detector 104), N filters (including a first filter 105 to an $N^{th}$ filter 106), and N clock reconstructors (including a first clock reconstructor 107 to an $N^{th}$ clock reconstructor 108).

N is an integer greater than or equal to 2. The N clock domain interfaces are in a one-to-one correspondence with the N phase frequency detectors, the N filters, and the N clock reconstructors. The N phase frequency detectors are respectively connected to N clock sources, and at least two clock sources of the N clock sources are different.

An $i^{th}$ phase frequency detector in the N phase frequency detectors is configured to receive a clock signal generated by a clock source connected to the $i^{th}$ phase frequency detector, determine $i^{th}$ phase difference information between a common reference clock signal and the clock signal, and send the $i^{th}$ phase difference information to an $i^{th}$ filter in the N filters that corresponds to the $i^{th}$ phase frequency detector.

It should be understood that the foregoing common reference clock signal may be generated by a common reference clock generator and is sent to the phase frequency detectors and the clock reconstructors in the device 100 using a bus. Moreover, there is one and only one common reference clock signal in one device.

The filter configured to receive the $i^{th}$ phase difference information sent by the $i^{th}$ phase frequency detector, convert the $i^{th}$ phase difference information into $i^{th}$ frequency difference information, and send the $i^{th}$ frequency difference information to an $i^{th}$ clock reconstructor in the N clock reconstructors that corresponds to the $i^{th}$ filter.

The $i^{th}$ clock reconstructor is configured to receive the $i^{th}$ frequency difference information sent by the $i^{th}$ filter, reconstruct an $i^{th}$ network timing clock in the device according to the common reference clock signal and the $i^{th}$ frequency difference information, and send the $i^{th}$ network timing clock to an $i^{th}$ clock domain interface in the N clock domain interfaces.

The i is an integer and satisfies $1 \leq i \leq N$.

The N clock domain interfaces of the device 100 are in a one-to-one correspondence with the N phase frequency detectors, the N filters, and the N clock reconstructors in the device. For example, the first clock domain interface 101 corresponds to the first phase frequency detector 103, the first filter 105, and the first clock reconstructor 107. Similarly, the $N^{th}$ clock domain interface 102 corresponds to the $N^{th}$ phase frequency detector 104, the $N^{th}$ filter 106, and the $N^{th}$ clock reconstructor 108. They may separately process clock signals from the N clock domain interfaces independently. The N phase frequency detectors are respectively connected to the N clock sources, and at least two clock sources of the N clock sources are different. It should be understood herein that one clock domain interface has only one clock source, and one clock source may be simultaneously connected to multiple clock domain interfaces to provide clock signals to the clock domain interfaces. Therefore, all or some of the clock signals from the N clock domain interfaces in this embodiment of this application may be the same, that is, same clock signals are from a same clock source. This is not limited in this embodiment of this application.

The i is an integer and satisfies 1≤i≤N, that is, each one of the N phase frequency detectors, the N filters, the N clock reconstructors, and the N clock domain interfaces may be configured to execute the foregoing operations. Further, each phase frequency detector in the N phase frequency detectors may separately receive the common reference clock signal and a clock signal generated by a clock source of a clock domain interface corresponding to the phase frequency detector, and then determine phase difference information between the common reference clock signal and the clock signal generated by the clock source of the clock domain interface corresponding to the phase frequency detector. In this way, the N phase frequency detectors can determine N pieces of phase difference information. Then, the N phase frequency detectors respectively send corresponding phase difference information to filters corresponding to the N phase frequency detectors. After receiving the respective phase difference information, each filter converts the phase difference information into frequency difference information and then sends the frequency difference information to a clock reconstructor corresponding to the filter. After receiving the frequency difference information corresponding to the N clock reconstructors, the N clock reconstructors may reconstruct network timing clocks of clock domain interfaces corresponding to the N clock reconstructors according to the common reference clock signal and the received frequency difference information, and finally send the network timing clocks to the clock domain interfaces corresponding to the N clock reconstructors.

The foregoing network timing clock should be understood as a co-frequency signal obtained after a clock signal of a clock source is filtered. An objective of network element timing is to distribute a reference source, which is input from a particular interface, to other interfaces of this clock domain after filtering the reference source in order to implement network-level synchronization.

Because inside one device, transfer of only one type of clock signal is supported, in this embodiment of this application, phase difference information between clock signals from different clock domains and the common reference clock signal is first calculated, the phase difference information is converted into frequency difference information, and then clock reconstructors reconstruct clock signals of needed clock domains at clock source interfaces according to the common reference clock signal. After clock signals of multiple different clock sources are received, the common reference clock signal is still transferred in the device, and clock reconstructors reconstruct clock signals of different clock domains at the clock source interfaces and separately send the clock signals to other clock domain interfaces of this clock domain, to further implement network-level clock synchronization. The foregoing device implements clock transfer of multiple clock domains by extracting differences between clock signals of different clock sources and the common reference clock.

In the device for supporting clock transfer of multiple clock domains in this embodiment of this application, a phase frequency detector obtains phase difference information between a clock signal generated by a clock source of each clock domain interface and a common reference clock signal, then a filter converts the phase difference information into frequency difference information, and finally, a clock reconstructor synthesizes a clock signal of a needed clock domain and applies the clock signal to a clock domain interface of each clock domain in order to flexibly adapt to multiple different clock domains and implement that a single device simultaneously supports clock transfer of multiple clock domains, user demands can be flexibly satisfied without adding or replacing devices.

It should be understood that in this embodiment of this application, because components are independent of each other, clock signals of the N clock domains are transferred independently. Transfer of the clock signals of the N clock domains may be conducted in a serial manner or in a parallel manner. This is not limited in this embodiment of this application.

In a specific implementation, after receiving two clock signals, a phase frequency detector may compare rising edge (that is, first clock edge) phases of two co-frequency clock signals using a logic circuit, to obtain a phase difference signal, and then perform sampling and quantization on the phase difference signal using a high frequency clock signal, to obtain and output phase difference information. The phase difference information is a digital quantity. Optionally, a double-D digital phase detector or a TDC may be used as the phase frequency detector (also referred to as PFD).

A filter mainly includes a digital filter module and a conversion module. A universal seven-order FIR filter module may be used as the digital filter module. The filter uses the phase difference information as an input, the digital filter module performs low-pass filtering on the phase difference information, and then the conversion module integrates the filtered phase difference information, to obtain frequency difference information. Finally, the filter uses the frequency difference information as an output. It should be understood that all processing in the filter is digital processing. In this embodiment of this application, the filter may be an Ethernet equipment clock (EEC) filter, an SDH equipment clock (SEC) filter, or an optical transport equipment clock (OEC) filter. This depends on a service type. In addition, the filter may be implemented using a common FIR structure and by means of digital signal processing (DSP). This is not limited in this embodiment of this application.

The clock reconstructor may be a DDS or an NCO. This is not limited in this embodiment of this application.

Optionally, the phase difference information and the frequency difference information may be encapsulated in a packet for transferring. The packet may be an Ethernet packet or may be a packet encapsulated using a high-level data link Control (HDLC) or a generic framing procedure (GFP). In addition, alternatively, the phase difference information and the frequency difference information may be encapsulated in a packet carrying a virtual local area network (VLAN) label or a multiprotocol label switching (MPLS) label. This is not limited in this embodiment of this application.

Optionally, for encapsulation of the phase difference information and the frequency difference information, Layer-2 encapsulation or Layer-3 encapsulation may be used. This is not limited in this embodiment of this application. Whether Layer-2 encapsulation or Layer-3 encapsulation is further used depends on a forwarding technology. If Layer-2 forwarding is used, Layer-2 encapsulation is used. If Layer-3 forwarding is selected, Layer-3 encapsulation is used. It should be understood that the "layer" herein refers to a hierarchy in a Transmission Control Protocol (TCP)/IP.

Layer 2 is a data link layer, and Layer 3 is a network layer. When packets of different hierarchies are forwarded, addressing manners are different. In Layer 2, addressing is performed using a Media Access Control (MAC) address, and in Layer 3, addressing is performed using an IP address.

Optionally, alternatively, for encapsulation of the phase difference information and the frequency difference information, any one of a frame structure in time division multiplexing (TDM), a frame structure in an asynchronous transfer mode (ATM), virtual containers-4 (VC-4), a frame structure in an optical transport network (OTN), a GFP frame, or a synchronous transfer mode (STM) frame. This is not limited in this embodiment of this application.

It should be understood that an internal system of the foregoing device may be implemented by inserting multiple cards on a same backplane. Channels for management and configuration are also needed between different cards. Currently, communication in a device is commonly implemented using a 100 megabits (Mb) Ethernet or a 1 gigabit (Gb) Ethernet.

It also should be understood that a transmission path of the phase difference information and the frequency difference information is a system bus, which may include, but is not limited to, common forms such as a fast Ethernet (FE)/Gigabit Ethernet (GE) interface in a system, a local bus, an inter-integrated circuit (I2C) bus, a serial peripheral interface (SPI) bus, an HDLC bus. This is not limited in this embodiment of this application.

In an optional embodiment, the device further includes an $(N+1)^{th}$ phase frequency detector and an external synchronization interface, where the $(N+1)^{th}$ phase frequency detector is connected to an external clock source using the external synchronization interface.

It should be understood that the external synchronization interface is a device interface not carrying services and carrying only clock signals. If the interface is interconnected to a high-precision clock source, the interface may be configured to use a clock signal of the high-precision clock source as a signal of a network timing clock of a clock domain in the device. If the interface is interconnected to a testing device, the interface may be configured to draw a clock signal of a particular clock domain and observe performance of the clock signal. Herein, the external clock source should be understood as a clock source connected to the external synchronization interface. The clock source may be a clock source of the foregoing N clock sources or may be another clock source. This is not limited in this embodiment of this application.

The $(N+1)^{th}$ phase frequency detector is configured to receive a clock signal generated by the external clock source, determine $(N+1)^{th}$ phase difference information between the clock signal generated by the external clock source and the common reference clock signal, and send the $(N+1)^{th}$ phase difference information to a $j^{th}$ filter in the N filters.

The $j^{th}$ filter is configured to receive the $(N+1)^{th}$ phase difference information sent by the $(N+1)^{th}$ phase frequency detector, convert the $(N+1)^{th}$ phase difference information into $(N+1)^{th}$ frequency difference information, and send the $(N+1)^{th}$ frequency difference information to a $j^{th}$ clock reconstructor in the N clock reconstructors that corresponds to the $j^{th}$ filter.

The $j^{th}$ clock reconstructor is configured to receive the $(N+1)^{th}$ frequency difference information sent by the $j^{th}$ filter, reconstruct an $(N+1)^{th}$ network timing clock in the device according to the common reference clock signal and the $(N+1)^{th}$ frequency difference information, and send the $(N+1)^{th}$ network timing clock to a $j^{th}$ clock domain interface in the N clock domain interfaces.

The j is an integer and satisfies $1 \le j \le N$.

Herein, j and i may or may not be equal. This is not limited in this embodiment of this application.

Further, the device further includes an $(N+1)^{th}$ phase frequency detector and an external synchronization interface, and may transfer a clock signal from the external synchronization interface. The $(N+1)^{th}$ phase frequency detector receives a clock signal generated by an external clock source connected to the external synchronization interface, determines $(N+1)^{th}$ phase difference information between the clock signal generated by the clock source of the external synchronization interface and the common reference clock signal, and sends the $(N+1)^{th}$ phase difference information to the $j^{th}$ filter in the N filters. The $j^{th}$ filter converts the $(N+1)^{th}$ phase difference information into $(N+1)^{th}$ frequency difference information and sends the $(N+1)^{th}$ frequency difference information to the $j^{th}$ clock reconstructor in the N clock reconstructors that corresponds to the $j^{th}$ filter. The $j^{th}$ clock reconstructor may reconstruct, in the device, a network timing clock of the external synchronization interface, and send the network timing clock to a clock domain interface corresponding to the $j^{th}$ clock reconstructor in the N clock domain interfaces.

It should be understood that the $(N+1)^{th}$ phase frequency detector may send phase difference information according to needs of a clock domain interface. For clock synchronization of any synchronization network, a clock signal of an external synchronization source may need to be obtained using an external synchronization interface. Therefore, any filter can process phase difference information between a clock source of the external synchronization interface and a common reference clock. The $(N+1)^{th}$ phase frequency detector may send the generated $(N+1)^{th}$ phase difference information to a corresponding filter according to needs of the clock domain interface.

In this way, the device can receive and reconstruct a clock signal from an external synchronization interface while supporting clock signal transfer of multiple different clock domains, and ensures that each clock domain interface of the device can receive the clock signal from the external synchronization interface according to needs. If the clock signal from the external synchronization interface has higher precision compared with a clock signal of each clock domain interface, the clock domain interface may use the clock signal from the external synchronization interface as a network timing clock of the clock domain interface in order to improve precision of clock signals in the device.

In an optional embodiment, the device further includes an $(N+1)^{th}$ clock reconstructor.

A $k^{th}$ filter in the N filters is configured to send $k^{th}$ frequency difference information generated by the $k^{th}$ filter to the $(N+1)^{th}$ clock reconstructor.

The $(N+1)^{th}$ clock reconstructor is configured to receive the $k^{th}$ frequency difference information sent by the $k^{th}$ filter, reconstruct a $k^{th}$ network timing clock in the device according to the $k^{th}$ frequency difference information, and send the $k^{th}$ network timing clock to the external synchronization interface.

The k is an integer and satisfies $1 \le k \le N$.

Herein, k and i may or may not be equal, and k and j may or may not be equal. This is not limited in this embodiment of this application.

In this embodiment, a user may test performance of clock signals in the device according to needs. Further, when the device is interconnected to another device, performance of clock signals in the device need to be tested. Alternatively, a particular testing device (for example, a meter) is directly connected to the device. Then, the device needs to output clock signals from multiple clock domains in the device using the external synchronization interface or output any one of the clock signals according to needs of the user. After knowing a network timing clock of a clock domain interface that is tested, the device sends the $k^{th}$ frequency difference information between the tested clock domain interface and the common reference clock signal to the $(N+1)^{th}$ clock reconstructor using a filter (that is, the $k^{th}$ filter) corresponding to the tested clock domain interface, and the $(N+1)^{th}$ clock reconstructor reconstructs the corresponding $k^{th}$ network timing clock, and sends the $k^{th}$ network timing clock to the external synchronization interface. The foregoing interconnection device or testing device may obtain different clock signals of the device using the external synchronization interface, and test performance of clock signals in the device.

It should be understood that the testing device or the interconnection device may select, according to needs, to test a clock source of a specific clock domain interface in the foregoing N clock domain interfaces or test a clock source of each clock domain interface in the foregoing N clock domain interfaces in sequence. This is not limited in this embodiment of this application.

Therefore, in the device of this embodiment of this application, clock signals from multiple different clock domains not only can be transferred between clock domain interfaces of the device but also can be transferred, using an external synchronization interface, to another device connected to the device in order to implement a performance test for clock signals in the device.

Figure 3:
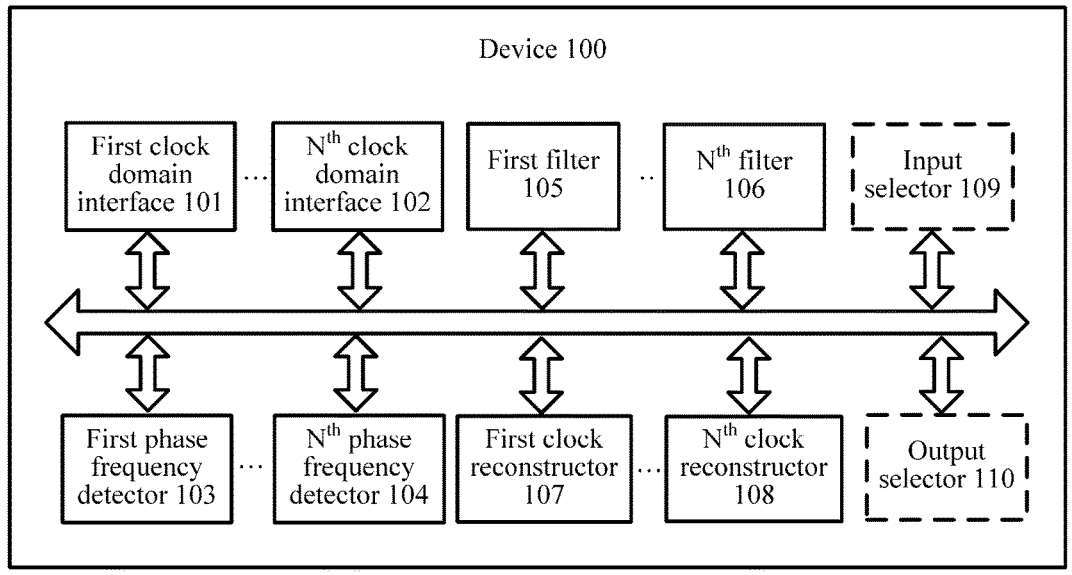
FIG. 3 is a schematic block diagram of another device for supporting clock transfer of multiple clock domains according to an embodiment of this application.

In an optional embodiment, as shown in FIG. 3, the device 100 further includes an input selector 109.

The $i^{th}$ phase frequency detector is further configured to send the $i^{th}$ phase difference information to the input selector 109.

The input selector 109 is configured to receive the $i^{th}$ phase difference information sent by the $i^{th}$ phase frequency detector, and send, based on a correspondence between the $i^{th}$ phase frequency detector and the $i^{th}$ filter, the $i^{th}$ phase difference information to the $i^{th}$ filter.

In an optional embodiment, the input selector 109 is further configured to, when clock sources of the N clock domain interfaces correspond to M types of services, select M pieces of phase difference information from phase difference information sent by the N phase frequency detectors, where the M pieces of phase difference information are in a one-to-one correspondence with the M types of services, and send, based on a correspondence between the N phase frequency detectors and the N filters, corresponding phase difference information to each filter in the N filters, where M is an integer less than N.

Further, the N clock domain interfaces may include clock domain interfaces of same services, that is, some of N services corresponding to the N clock domain interfaces are the same. Same services in the N services are classified as one type of service. It is set that the N services include M types of services. Therefore, the input selector 109 is needed to perform a source selection operation on phase difference information from clock sources of the N services and select M pieces of phase difference information corresponding to the M types of services from N pieces of phase difference information corresponding to the N services such that services of a same type in the N services all follow an optimal clock source in this type.

After receiving N pieces of phase difference information corresponding to the N clock sources, the input selector may select the M pieces of phase difference information from the N pieces of phase difference information. If the N pieces of phase difference information each carry a synchronization status message (SSM), the input selector may independently perform source selection according to the SSM. The source selection operation may be performed according to a source selection protocol, for example, an SSM protocol. The SSM protocol may be any version of ITU-T G.8264. Alternatively, if the N pieces of phase difference information do not carry a synchronization status message, the input selector 109 may perform manual source selection according to an instruction of the user. This is not limited in this embodiment of this application.

After the source selection operation ends, the input selector 109 selects the M pieces of phase difference information one-to-one corresponding to the M types of services, that is, clock domain interfaces having same services in the N clock domain interfaces all use the phase difference information that corresponds to a same clock source and that is selected by the input selector 109. Then the input selector 109 sends corresponding phase difference information to each filter in the N filters based on a correspondence between the M pieces of phase difference information and the N filters.

In a specific implementation, the input selector 109 may perform processing according to requirements of an upper-layer protocol. For example, the phase frequency detector may add identification information of a corresponding filter to the phase difference information and configure the identification information into the input selector 109. The input selector 109 can determine a correspondence between the phase frequency detector and the filter according to the phase difference information. The identification information is only used to distinguish the filters from each other and may be an identifier, a port number, and the like of a filter corresponding to the phase frequency detector. This is not limited in this embodiment of this application.

It should be understood that the foregoing input selector may be implemented in the device using software of a CPU or using an FPGA) hardware. This is not limited in this embodiment of this application.

In an optional embodiment, as shown in FIG. 3, the device 100 further includes an output selector 110.

The $i^{th}$ filter is further configured to send the $i^{th}$ frequency difference information to the output selector 110.

The output selector 110 is configured to receive the $i^{th}$ frequency difference information sent by the $i^{th}$ filter, and send the $i^{th}$ frequency difference information to the $i^{th}$ clock reconstructor based on a correspondence between the $i^{th}$ filter and the $i^{th}$ clock reconstructor.

Further, the output selector 110 may transfer the foregoing frequency difference information to the N clock reconstructors in any one of a broadcast, multicast, or unicast manner. Optionally, the output selector 110 may construct a multicast packet carrying the frequency difference information and send the multicast packet to the clock reconstructors. Optionally, the output selector 110 may also send corresponding frequency difference information to a clock reconstructor corresponding to a service that needs clock transfer according to setting of the user. This is not limited in this embodiment of this application.

In addition, if performance of a clock signal within the device needs to measured using the external synchronization interface, the output selector 110 may further be configured to send, to an (N+1)$^{th}$ clock reconstructor, (N+1)$^{th}$ frequency difference information corresponding to the clock signal to be measured.

In a specific implementation, the frequency difference information sent from the output selector 110 is encapsulated in a packet, and the packet may carry a source address and a destination address. The packet may be forwarded. In the device, there is a component responsible for packet exchange. Different addresses are added to the front of the frequency difference information, and then forwarding can be implemented using the packet exchange component. In this way, the output selector 110 may forward the frequency difference information to the clock reconstructors according to correspondence.

It should be understood that the foregoing output selector may be implemented in the device using software of a CPU or using an FPGA hardware. This is not limited in this embodiment of this application.

In an optional embodiment, the device 100 further includes a common reference clock generator (not shown) configured to generate the common reference clock signal before the i$^{th}$ phase difference information between the common reference clock signal and the clock signal is determined, and send the common reference clock signal to the i$^{th}$ phase frequency detector and the i$^{th}$ clock reconstructor.

It should be understood that the common reference clock signal is generated by the common reference clock generator and is sent to the phase frequency detectors and the clock reconstructors using a bus, and there is one and only one common reference clock signal in a device. Optionally, the common reference clock signal may be implemented using a general phase-locked loop technology.

Optionally, the device 100 further includes a system bus configured to connect the N phase frequency detectors, the N filters, the N clock reconstructors, and the N clock domain interfaces, and bidirectionally transfer phase difference information determined by the N phase frequency detectors and frequency difference information converted by the N filters.

The "connection" involved in this embodiment and subsequent embodiments should be understood as an electric connection rather than a direct connection. This connection may be implemented indirectly using a third-party component.

In the device for supporting clock transfer of multiple clock domains in this embodiment of this application, a phase frequency detector obtains phase difference information between a clock signal generated by a clock source of each clock domain interface and a common reference clock signal, then a filter converts the phase difference information into frequency difference information, and finally, a clock reconstructor synthesizes a clock signal of a needed clock domain and applies the clock signal to a clock domain interface of each clock domain in order to flexibly adapt to multiple different clock domains and implement that a single device simultaneously supports clock transfer of multiple clock domains, user demands can be flexibly satisfied without adding or replacing devices.

Figure 4:
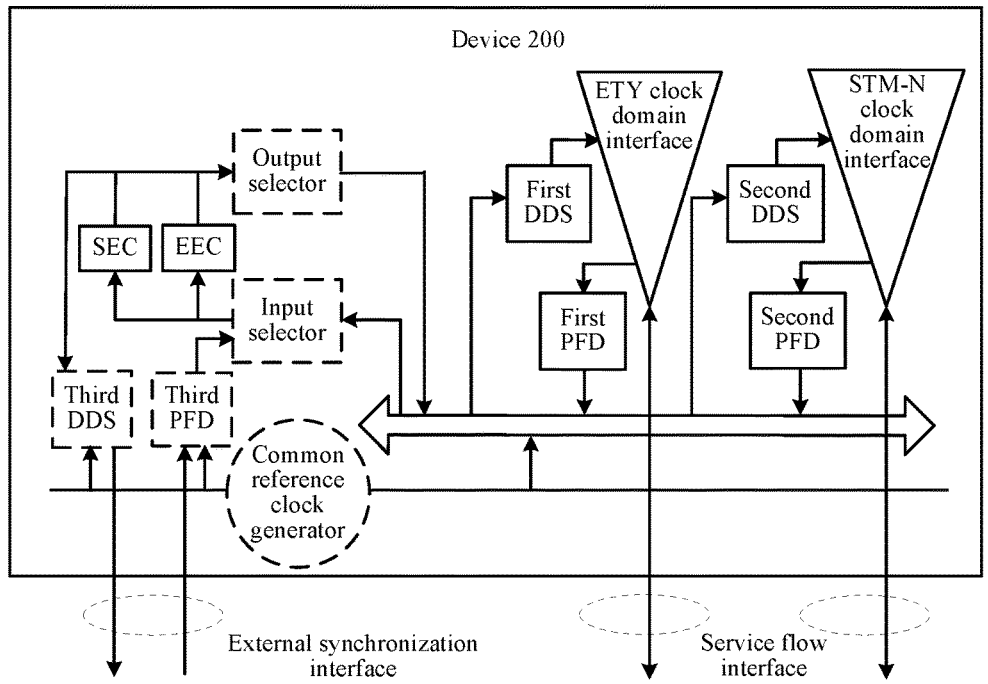
FIG. 4 is a schematic block diagram of another device for supporting clock transfer of multiple clock domains according to an embodiment of this application.

FIG. 4 is a schematic block diagram of another device 200 for supporting clock transfer of multiple clock domains according to an embodiment of this application. The device 200 may correspond to the hybrid service bearing device C in FIG. 1, and the device 200 may be understood as a specific implementation of the device 100 in FIG. 2 or FIG. 3. As shown in FIG. 4, the device 200 includes an Ethernet Physical Layer Network (ETY) clock domain interface configured to send a clock signal generated by a clock source of a synchronous Ethernet line clock to a first PFD, a Synchronous Transport Module level N (STM-N) clock domain interface configured to send a clock signal generated by a clock source of an SDH line clock to a second PFD, the first PFD configured to determine first phase difference information between a common reference clock signal and the clock signal of the synchronous Ethernet line clock, and send the first phase difference information to an EEC filter module, the second PFD configured to determine second phase difference information between the common reference clock signal and the clock signal of the synchronous Ethernet line clock, and send the second phase difference information to an SEC filter module, the EEC filter module configured to perform low-pass filtering on the first phase difference information, convert the first phase difference information into first frequency difference information between the common reference clock signal and a network timing clock of the ETY clock domain interface, and send the first frequency difference information to a first DDS, the EEC filter module is configured to perform, on the first phase difference information, low-pass filtering meeting the standard ITU-T G.8262, the SEC filter module configured to perform low-pass filtering on the second phase difference information, convert the second phase difference information into second frequency difference information between the common reference clock signal and a network timing clock of the STM-N clock domain interface, and send the second frequency difference information to a second DDS, the SEC filter module is configured to perform, on the second phase difference information, low-pass filtering meeting the standard ITU-T G.813, the first DDS configured to receive the first frequency difference information sent by the EEC filter module, reconstruct the network timing clock of the ETY clock domain interface according to the common reference clock signal and the first frequency difference information, send the network timing clock to the ETY clock domain interface, and apply the network timing clock to a corresponding service flow interface, and the second DDS configured to receive the second frequency difference information sent by the SEC filter module, reconstruct the network timing clock of the STM-N clock domain interface according to the common reference clock signal and the second frequency difference information, send the network timing clock to the STM-N clock domain interface, and apply the network timing clock to a corresponding service flow interface.

It should be understood that the first DDS and the second DDS are a specific implementation of the clock reconstructor in FIG. 2 or FIG. 3.

In the device for supporting clock transfer of multiple clock domains in this embodiment of this application, a frequency phase detector obtains phase difference information between a clock signal generated by a clock source of each clock domain interface and a common reference clock signal, then a filter converts the phase difference information into frequency difference information, and finally, a clock reconstructor synthesizes a clock signal of a needed clock domain and applies the clock signal to a clock domain interface of each clock domain in order to flexibly adapt to multiple different clock domains and implement that a single device simultaneously supports clock transfer of multiple clock domains, user demands can be flexibly satisfied without adding or replacing devices.

In an optional embodiment, the device 200 further includes a common reference clock generator configured to generate the common reference clock signal and send the common reference clock signal to the first PFD, the second PFD, the first DDS, and the second DDS using a bus. One common reference clock signal is shared in the device 200.

In an optional embodiment, the device 200 further includes a third PFD and an external synchronization interface.

The common reference clock generator is further configured to send the common reference clock signal to the third PFD.

The third PFD is configured to determine third phase difference information between the common reference clock signal and a clock signal of the external synchronization interface, and send the third phase difference information to the EEC filter module or the SEC filter module.

It should be understood that the clock signal of the external synchronization interface may be processed by the SEC filter module or by the EEC filter module. The device may determine, according to needs of services, a filter module to which the clock signal of the external synchronization interface is sent.

If the clock signal of the external synchronization interface is the clock signal generated by the clock source of the synchronous Ethernet line clock, the EEC filter module may be further configured to perform low-pass filtering on the third phase difference information, convert the third phase difference information into the third frequency difference information between the common reference clock and the network timing clock of the ETY clock domain interface, and send the third frequency difference information to the first DDS. Preferably, the EEC filter module is configured to perform, on the third phase difference information, low-pass filtering meeting the standard ITU-T G.8262.

The first DDS may be further configured to receive the third frequency difference information sent by the EEC filter module, reconstruct the network timing clock of the external synchronization interface according to the common reference clock signal and the third frequency difference information, and apply the network timing clock to a corresponding service flow interface.

If the clock signal of the external synchronization interface is the clock signal generated by the clock source of the SDH line clock, the SEC filter module may be further configured to perform low-pass filtering on the third phase difference information, convert the third phase difference information into the third frequency difference information between the common reference clock and the network timing clock of the STM-N clock domain interface, and send the third frequency difference information to the second DDS. Preferably, the SEC filter module is configured to perform, on the third phase difference information, low-pass filtering meeting the standard ITU-T G.813.

The second DDS may be further configured to receive the third frequency difference information sent by the SEC filter module, reconstruct the network timing clock of the external synchronization interface according to the common reference clock signal and the third frequency difference information, and apply the network timing clock to a corresponding service flow interface.

In an optional embodiment, the device 200 further includes a third DDS.

The common reference clock generator is further configured to send the common reference clock signal to the third DDS.

The EEC filter module is further configured to send the first frequency difference information to the third DDS.

The SEC filter module is further configured to send the second frequency difference information to the third DDS.

The third DDS is configured to receive the first frequency difference information sent by the EEC filter module or the second frequency difference information sent by the SEC filter module, reconstruct a network timing clock corresponding to the clock domain interface according to the first frequency difference information or the second frequency difference information and the common reference clock signal, and send the network timing clock to the external synchronization interface.

In an optional embodiment, the device 200 further includes an input selector.

The first PFD is further configured to send the first phase difference information to the input selector.

The second PFD is further configured to send the second phase difference information to the input selector.

The third PFD is further configured to send the third phase difference information to the input selector.

The input selector is configured to receive the first phase difference information, the second phase difference information, and the third phase difference information, send the first phase difference information to the EEC filter module, send the second phase difference information to the SEC filter module, and send the third phase difference information to the SEC filter module or the EEC filter module.

In an optional embodiment, the device 200 further includes an output selector.

The EEC filter module is further configured to send the first frequency difference information or the third frequency difference information to the output selector.

The SEC filter module is further configured to send the second frequency difference information or the third frequency difference information to the output selector.

The output selector is configured to receive the first frequency difference information, the second frequency difference information, and the third frequency difference information, send the first frequency difference information to the first DDS, send the second frequency difference information to the second DDS, and send the third frequency difference information to the first DDS or the second DDS according to needs.

Alternatively, the output selector may send the first frequency difference information or the second frequency difference information to the third DDS such that another device (for example, a testing device) measures performance of a clock signal in the device using the external synchronization interface.

The device for supporting clock transfer of multiple clock domains in the embodiments of this application is described in detail above with reference to FIG. 1 to FIG. 4. A method for supporting clock transfer of multiple clock domains in the embodiments of this application is described below with reference to FIG. 5.

FIG. 5 is a schematic diagram of a method 300 for supporting clock transfer of multiple clock domains according to an embodiment of this application. The method 300 may be executed by the foregoing device 100 or device 200. As shown in FIG. 5, the method 300 includes the following steps.

Step S310: An $i^{th}$ phase frequency detector in N phase frequency detectors receives a clock signal generated by a clock source connected to the $i^{th}$ phase frequency detector, determines $i^{th}$ phase difference information between a common reference clock signal and the clock signal, and sends the $i^{th}$ phase difference information to an $i^{th}$ filter in N filters that corresponds to the $i^{th}$ phase frequency detector.

Step S320: The $i^{th}$ filter receives the phase difference information sent by the $i^{th}$ phase frequency detector, converts the $i^{th}$ phase difference information into $i^{th}$ frequency difference information, and sends the $i^{th}$ frequency difference information to an $i^{th}$ clock reconstructor in N clock reconstructors that corresponds to the $i^{th}$ filter.

Step S330: The $i^{th}$ clock reconstructor receives the frequency difference information sent by the $i^{th}$ filter, reconstructs an $i^{th}$ network timing clock in the device according to the common reference clock signal and the $i^{th}$ frequency difference information, and sends the $i^{th}$ network timing clock to an clock domain interface in N clock domain interfaces.

N is an integer greater than or equal to 2, the N clock domain interfaces are in a one-to-one correspondence with the N phase frequency detectors, the N filters, and the N clock reconstructors, the N phase frequency detectors are respectively connected to N clock sources, at least two clock sources of the N clock sources are different, and i is an integer and satisfies 1≤i≤N.

In an optional embodiment, the method further includes receiving, by an $(N+1)^{th}$ phase frequency detector, a clock signal generated by an external clock source, determining $(N+1)^{th}$ phase difference information between the clock signal generated by the external clock source and the common reference clock signal, and sending the $(N+1)^{th}$ phase difference information to a $j^{th}$ filter in the N filters, receiving, by the $j^{th}$ filter, the $(N+1)^{th}$ phase difference information sent by the $(N+1)^{th}$ phase frequency detector, converting the $(N+1)^{th}$ phase difference information into $(N+1)^{th}$ frequency difference information, and sending the $(N+1)^{th}$ frequency difference information to a $j^{th}$ clock reconstructor in the N clock reconstructors that corresponds to the $j^{th}$ filter, and receiving, by the $j^{th}$ clock reconstructor, the $(N+1)^{th}$ frequency difference information sent by the $j^{th}$ filter, reconstructing an $(N+1)^{th}$ network timing clock in the device according to the common reference clock signal and the $(N+1)^{th}$ frequency difference information, and sending the $(N+1)^{th}$ network timing clock to a $j^{th}$ clock domain interface in the N clock domain interfaces.

The $(N+1)^{th}$ phase frequency detector is connected to an external clock source using an external synchronization interface, and j is an integer and satisfies 1≤j≤N.

In this way, the device can receive and reconstruct a clock signal from an external synchronization interface while supporting clock signal transfer of multiple different clock domains, and ensures that each clock domain interface of the device can receive the clock signal from the external synchronization interface according to needs. If the clock signal from the external synchronization interface has higher precision compared with a clock signal of each clock domain interface, the clock domain interface may use the clock signal from the external synchronization interface as a network timing clock of the clock domain interface in order to improve precision of clock signals in the device.

In an optional embodiment, the method further includes sending, by a $k^{th}$ filter in the N filters, $k^{th}$ frequency difference information generated by the $k^{th}$ filter to an $(N+1)^{th}$ clock reconstructor, and receiving, by the $(N+1)^{th}$ clock reconstructor, the $k^{th}$ frequency difference information sent by the $k^{th}$ filter, reconstructing a $k^{th}$ network timing clock in the device according to the $k^{th}$ frequency difference information, and sending the $k^{th}$ network timing clock to the external synchronization interface, where k is an integer and satisfies 1≤k≤N.

Further, in addition to sending the $k^{th}$ frequency difference information to the $k^{th}$ clock reconstructor, the $k^{th}$ filter may further send the $k^{th}$ frequency difference information to the $(N+1)^{th}$ clock reconstructor. In this way, clock signals from multiple different clock domains not only can be transferred between clock domain interfaces of the device but also can be transferred, using an external synchronization interface, to another device connected to the device in order to implement a performance test for clock signals in the device.

In an optional embodiment, the sending the $i^{th}$ phase difference information to an $i^{th}$ filter in N filters that corresponds to the $i^{th}$ phase frequency detector includes sending, by the $i^{th}$ phase frequency detector, the $i^{th}$ phase difference information to an input selector, and receiving, by the input selector, the $i^{th}$ phase difference information sent by the $i^{th}$ phase frequency detector, and sending, based on a correspondence between the $i^{th}$ phase frequency detector and the $i^{th}$ filter, the $i^{th}$ phase difference information to the $i^{th}$ filter.

In an optional embodiment, after the input selector receives the $i^{th}$ phase difference information sent by the $i^{th}$ phase frequency detector, the method further includes when clock sources of the N clock domain interfaces correspond to M types of services, selecting, by the input selector, M pieces of phase difference information from phase difference information sent by the N phase frequency detectors, where the M pieces of phase difference information are in a one-to-one correspondence with the M types of services.

The sending the $i^{th}$ phase difference information to the $i^{th}$ filter includes sending, based on a correspondence between the N phase frequency detectors and the N filters, corresponding phase difference information to each filter in the N filters.

The M is an integer less than N.

In an optional embodiment, the sending the $i^{th}$ frequency difference information to an $i^{th}$ clock reconstructor in N clock reconstructors that corresponds to the filter includes sending, by the $i^{th}$ filter, the $i^{th}$ frequency difference information to an output selector, and receiving, by the output selector, the $i^{th}$ frequency difference information sent by the $i^{th}$ filter, and sending the $i^{th}$ frequency difference information to the $i^{th}$ clock reconstructor based on a correspondence $i^{th}$ between the $i^{th}$ filter and the $i^{th}$ clock reconstructor.

In an optional embodiment, before the determining $i^{th}$ phase difference information between a common reference clock signal and the clock signal, the method further includes generating, by a common reference clock generator, the common reference clock signal, and sending the common reference clock signal to the $i^{th}$ phase frequency detector and the $i^{th}$ clock reconstructor.

In the method for supporting clock transfer of multiple clock domains in this embodiment of this application, a phase frequency detector obtains phase difference information between a clock signal generated by a clock source of each clock domain interface and a common reference clock signal, then a filter converts the phase difference information into frequency difference information, and finally, a clock reconstructor synthesizes a clock signal of a needed clock domain and applies the clock signal to a clock domain interface of each clock domain in order to flexibly adapt to multiple different clock domains and implement that a single device simultaneously supports clock transfer of multiple clock domains, user demands can be flexibly satisfied without adding or replacing devices.

It should be understood that "one embodiment" or "an embodiment" mentioned throughout the specification indicates that a particular characteristic, structure or property that is related to the embodiment is included in at least one embodiment of this application. Therefore, "in one embodiment" or "in an embodiment" that appears throughput the entire specification does not necessarily mean a same embodiment. Moreover, the particular characteristic, structure or property may be combined in one or more embodiments in any proper manner.

It should be understood that sequence numbers of the foregoing processes do not mean execution sequences in various embodiments of this application. The execution sequences of the processes should be determined according to functions and internal logic of the processes, and should not be construed as any limitation on the implementation processes of the embodiments of this application.

A person of ordinary skill in the art may be aware that, in combination with the examples described in the embodiments disclosed in this specification, method steps and units may be implemented by electronic hardware, computer software, or a combination thereof. To clearly describe the interchangeability between the hardware and the software, the foregoing has generally described steps and compositions of each embodiment according to functions. Whether the functions are performed by hardware or software depends on particular applications and design constraint conditions of the technical solutions. A person of ordinary skill in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein.

In the several embodiments provided in this application, it should be understood that the disclosed apparatus and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments in this application.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of this application essentially, or the part contributing to other approaches, or all or a part of the technical solutions may be implemented in the form of a software product. The software product is stored in a storage medium and includes several instructions for instructing a computer device (which may be a personal computer, a server, or a network device) to perform all or a part of the steps of the methods described in the embodiments of this application. The foregoing storage medium includes any medium that can store program code, such as a universal serial bus (USB) flash drive, a removable hard disk, a read-only memory (ROM), a random access memory (RAM), a magnetic disk, or an optical disc.

The foregoing descriptions are merely specific embodiments of this application, but are not intended to limit the protection scope of this application. Any modification or replacement readily figured out by a person skilled in the art within the technical scope disclosed in this application shall fall within the protection scope of this application. Therefore, the protection scope of this application shall be subject to the protection scope of the claims.

What is claimed is:

1. A method implemented by a device, comprising:
   receiving N clock signals, wherein at least two clock signals of the N clock signals are different, and wherein the N is an integer greater than or equal to two;
   determining N pieces of phase difference information between the N clock signals and a common reference clock respectively;
   acquiring N pieces of frequency difference information based on the N pieces of phase difference information respectively;
   reconstructing N network timing clocks in the device based on the common reference clock signal and the N pieces of frequency difference information; and
   sending the N network timing clocks to N clock domain interfaces respectively, wherein the N network timing clocks are in a one-to-one correspondence with the N clock domain interfaces.

2. The method of claim 1, further comprising:
   receiving an $(N+1)^{th}$ clock signal from an external synchronization interface;
   determining $(N+1)^{th}$ phase difference information between the $(N+1)^{th}$ clock signal and the common reference clock;
   acquiring $(N+1)^{th}$ frequency difference information based on the $(N+1)^{th}$ phase difference information;
   reconstructing an $(N+1)^{th}$ network timing clock in the device based on the common reference clock signal and the $(N+1)^{th}$ frequency difference information; and
   sending the $(N+1)^{th}$ network timing clock to a clock domain interface in the N clock domain interfaces.

3. A non-transitory computer readable medium storing a program causing a computer to execute a process comprising:
   receiving N clock signals, wherein at least two clock signals of the N clock signals are different, and wherein the N is an integer greater than or equal to two;
   determining N pieces of phase difference information between the N clock signals and a common reference clock respectively;
   acquiring N pieces of frequency difference information based on the N pieces of phase difference information respectively;
   reconstructing N network timing clocks in the device based on the common reference clock signal and the N pieces of frequency difference information; and
   sending the N network timing clocks to N clock domain interfaces respectively, wherein the N network timing clocks are in a one-to-one correspondence with the N clock domain interfaces.

4. The non-transitory computer readable medium of claim 3, wherein the process further comprises:
- receiving an $(N+1)^{th}$ clock signal from an external synchronization interface;
- determining $(N+1)^{th}$ phase difference information between the $(N+1)$ clock signal and the common reference clock;
- acquiring $(N+1)^{th}$ frequency difference information based on the $(N+1)^{th}$ phase difference information;
- reconstructing an $(N+1)^{th}$ network timing clock in the device based on the common reference clock signal and the $(N+1)^{th}$ frequency difference information; and
- sending the $(N+1)^{th}$ network timing clock to a clock domain interface in the N clock domain interfaces.

5. A device, comprising:
- N phase frequency detectors configured to:
  - receive N clock signals, wherein at least two clock signals of the N clock signals are different, wherein the N is an integer greater than or equal to two; and
  - determine N pieces of phase difference information between the N clock signals and a common reference clock respectively;
- N filters configured to acquire N pieces of frequency difference information based on the N pieces of phase difference information respectively; and
- N clock reconstructors configured to:
  - reconstruct N network timing clocks in the device based on the common reference clock signal and the N pieces of frequency difference information; and
  - send the N network timing clocks to N clock domain interfaces respectively, wherein the N network timing clocks are in a one-to-one correspondence with the N clock domain interfaces.

6. The device of claim 5, further comprising:
- an $(N+1)^{th}$ phase frequency detector configured to:
  - receive an $(N+1)^{th}$ clock signal from an external synchronization interface; and
  - determine $(N+1)^{th}$ phase difference information between the $(N+1)$ clock signal and the common reference clock;
- wherein a $j^{th}$ filter in the N filters is configured to:
  - acquire the $(N+1)^{th}$ frequency difference information based on the $(N+1)^{th}$ phase difference information; and
  - send the $(N+1)^{th}$ frequency difference information to a $j^{th}$ clock reconstructor in the N clock reconstructors corresponding to the $j^{th}$ filter, and
- wherein the $j^{th}$ clock reconstructor is configured to:
  - receive the $(N+1)^{th}$ frequency difference information from the $j^{th}$ filter;
  - reconstruct an $(N+1)^{th}$ network timing clock in the device based on the common reference clock signal and the $(N+1)^{th}$ frequency difference information; and
  - send the $(N+1)^{th}$ network timing clock to a $j^{th}$ clock domain interface in the N clock domain interfaces, the j being an integer satisfying a condition $1 \leq j \leq N$.

7. The device of claim 6, further comprising:
- an $(N+1)^{th}$ clock reconstructor;
- a $k^{th}$ filter in the N filters being configured to send $k^{th}$ frequency difference information from the $k^{th}$ filter to the $(N+1)^{th}$ clock reconstructor; and
- the $(N+1)^{th}$ clock reconstructor being configured to:
  - receive the $k^{th}$ frequency difference information from the $k^{th}$ filter;
  - reconstruct a $k^{th}$ network timing clock in the device based on the $k^{th}$ frequency difference information; and
  - send the $k^{th}$ network timing clock to the external synchronization interface, the k comprising an integer satisfying a condition $1 \leq k \leq N$.

8. The device of claim 5, further comprising an input selector coupled to the N phase frequency detectors and the N filters, the N phase frequency detectors being further configured to send the N pieces of phase difference information to the input selector, and the input selector being configured to:
- receive the N pieces of phase difference information; and
- send, based on a correspondence between the N phase frequency detector and the N filters, the N pieces of phase difference information to the N filters respectively.

9. The device of claim 8, wherein the input selector is further configured to:
- select M pieces of phase difference information from the N pieces of phase difference information received from the N phase frequency detectors when clock sources of the N clock domain interfaces correspond to M types of services, the M pieces of phase difference information comprising a one-to-one correspondence with the M types of services; and
- send, based on a correspondence between the N phase frequency detectors and the N filters, corresponding phase difference information to each filter in the N filters, the M being an integer less than N.

10. The device of claim 5, further comprising an output selector coupled to the N filters and the N clock reconstructors, the N filters being further configured to send the N pieces of frequency difference information to the output selector respectively, and the output selector being configured to:
- receive the N pieces of frequency difference information from the N filters; and
- send, based on a correspondence between the N filters and the N clock reconstructors, the N pieces of frequency difference information to the N clock reconstructors respectively.

11. The device of claim 5, further comprising a common reference clock generator coupled to the N phase frequency detectors and the N clock reconstructors and configured to:
- generate the common reference clock signal; and
- send the common reference clock signal to the N phase frequency detectors and the N clock reconstructors respectively.

12. The device of claim 5, wherein the device is a Global System for Mobile Communications (GSM) device.

13. The device of claim 5, wherein the device is a Code Division Multiple Access (CDMA) device.

14. The device of claim 5, wherein the device is a Wideband Code Division Multiple Access (WCDMA) device.

15. The device of claim 5, wherein the device is a general packet radio service (GPRS) device.

16. The device of claim 5, wherein the device is a Long Term Evolution (LTE) device.

17. The device of claim 5, wherein the device is a Long Term Evolution (LTE) frequency division duplex (FDD) device.

18. The device of claim 5, wherein the device is a Long Term Evolution (LTE) time division duplex (TDD) device.

19. The device of claim 5, wherein the device is a Universal Mobile Telecommunications System (UMTS) device.

20. The device of claim 5, wherein the device is either a network device or a terminal device.

* * * * *